United States Patent [19]
Yagyu

[11] Patent Number: 4,982,079
[45] Date of Patent: Jan. 1, 1991

[54] PHOTO-SENSOR HAVING PLURAL TRANSPARENT LAYERS AND A CONDUCTIVE LAYER TO REDUCE ELECTROSTASLIC CHARGES

[75] Inventor: Mineto Yagyu, Sagamihara, Japan

[73] Assignee: Canon Kabushiki Kaisha, Tokyo, Japan

[21] Appl. No.: 204,520

[22] Filed: Jun. 9, 1988

[30] Foreign Application Priority Data

Jun. 12, 1987 [JP] Japan ................................ 62-146374
Nov. 13, 1987 [JP] Japan ................................ 62-285617

[51] Int. Cl.$^5$ ....................... H01L 27/14; H01L 31/00
[52] U.S. Cl. ................................... 250/208.1; 357/30; 250/211 R; 358/494
[58] Field of Search ............... 250/578, 211 R, 208.1; 357/2, 30 D, 30 H, 30 K, 30 R; 358/494, 213.11, 213.13

[56] References Cited

U.S. PATENT DOCUMENTS 3,840,391 10/1974 Spitz .
4,474,457 10/1984 Phelps .
4,691,243 9/1987 Cannella .......................... 358/213.11
4,691,244 9/1987 Cannella .......................... 358/213.11
4,727,407 2/1988 Nobue et al. ............................. 357/2
4,746,989 5/1988 Cannella .
4,791,466 12/1988 Kato ................................. 357/30 H
4,855,795 8/1989 Yamamoto et al. ............... 357/30 H

OTHER PUBLICATIONS

M. Labeau, et al., "Depot de Couches Minces D'Oxydes Par Pyrolyse d'un Aerosol, L'Oxyde Transparent Conducteur DdIn$_2$O$_4$", undated (in French).

Primary Examiner—Edward P. Westin
Attorney, Agent, or Firm—Fitzpatrick, Cella, Harper & Scinto

[57] ABSTRACT

A photo-sensor comprises plural photoelectric converting elements arranged on a substrate. A transparent insulative protective element is disposed over the plural photoelectric converting elements, with an electrostatic shielding layer disposed over the substrate. The transparent insulative protective element comprises a multi-layer structure, and at least one layer of the multi-layer structure is disposed on the electrostatic shielding layer.

25 Claims, 9 Drawing Sheets

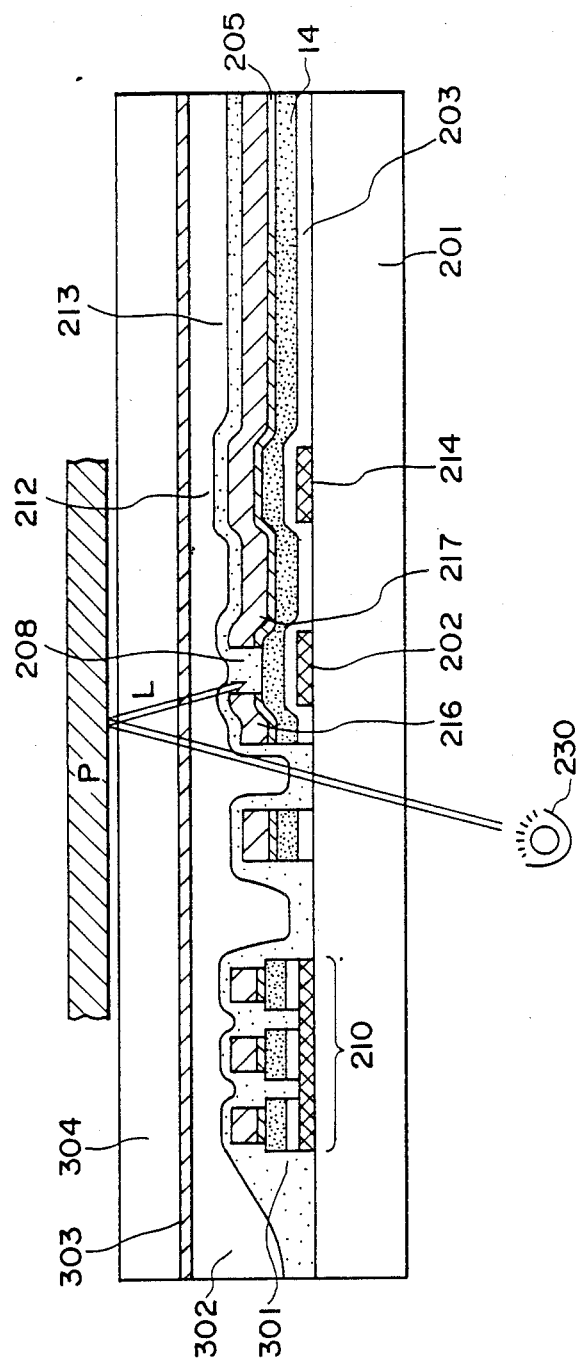

PHOTO-SENSOR HAVING PLURAL TRANSPARENT LAYERS AND A CONDUCTIVE LAYER TO REDUCE ELECTROSTASLIC CHARGES

BACKGROUND OF THE INVENTION

1. Field of the Invention

The present invention relates to an image reading apparatus and, more particularly, to an image reading apparatus suitable for use in a facsimile apparatus, an image reader, a digital copier, or the like in which a one-dimensional line sensor corresponding to the width of an original is provided. The image information is read while relatively moving the original whose image is to be read in close contact with this line sensor.

2. Related Background Art

Hitherto, as such kind of image reading apparatus which is called a contact type, there have been manufactured many various kinds of apparatuses in which the image on an original is projected onto a photo-sensor having photoelectric converting elements using a rod lens array, a convergent fiber, or the like, thereby reading the original image.

On the other hand, in recent years, there has been developed an image reading apparatus of the type in which a thin transparent protective layer coated onto the photo sensor section is provided for cost reduction and miniaturization. The original image is read while moving the original in close contact relation with the transparent protective layer on the photo sensor.

FIG. 1A shows an example of such a conventional image reading apparatus. In the diagram, a photoelectric converting element section 1 comprising elements 6 and 14 and electrodes 216 and 217 is formed on an opaque layer 3 formed on a transparent substrate 2. Light L is irradiated from a light source 4, arranged on the back surface side of the substrate 2, and enters through a window portion (a portion on which the opaque layer 3 is not formed) 5. The light L is reflected by the surface of an original P and received by the photoelectric converting element section 1. The following functions are required for a transparent protective layer 20: the irradiation of a sufficient amount of light onto the upper surface of the photoelectric converting element; the protection and stability of the semiconductor layer surface and electrode section on the upper surface of the photoelectric converting element; and the prevention of deterioration in resolution which is caused by scratches and dusts of an original or the like. However, the transparent protective layer 20 generally has a high insulative property. Therefore, when an original having image information to be read moves on the protective layer in close contact relation therewith, electrostatic charges are generated, causing inconveniences such as level shift of the signal, malfunction of a signal processing section, and the like.

Therefore, in the conventional techniques, for example, as shown in FIG. 1-B, an electrostatic shielding layer 21 made of ITO, $SnO_2$, or the like is formed on the original contacting surface on the protective layer 20 the potentials are maintained at a constant value, thereby electrically shielding the photoelectric converting element section and preventing an adverse influence by the generation of the electrostatic charges.

As disclosed in U.S. Pat. Nos. 4,691,243 or 4,691,244, there has been proposed a method whereby the electrostatic shielding layer 21 is directly provided between a photoelectric converting layer 14' and the protective layer 20 and the potentials are held at a constant value, thereby preventing an adverse influence by the generation of the electrostatic charges (refer to FIG. 1-C).

However, in the conventional structure such that the electrostatic shielding layer directly comes into contact with the surface of an ordinary original as mentioned above, scratches are easily caused on the electrostatic shielding layer by the original and dusts, and the electrostatic shielding layer is abraded. Thus, not only the function for a countermeasure of the electrostatic charges deteriorates but also an amount of light which is irradiated onto the photoelectric converting layer becomes unstable or the like. The function as an image reading apparatus is adversely influenced.

On the other hand, in the structure such that the electrostatic shielding layer is directly formed between the photoelectric converting layer and the protective layer, the photoelectric converting layer cannot be electro-mechanically protected, so that such a structure cannot be substantially used.

Therefore, unless all of the foregoing electrical, optical, and mechanical problems can be solved, the complete contact type image reading apparatus is not realized.

SUMMARY OF THE INVENTION

It is an object of the present invention to provide an image reading apparatus in which the inconveniences of the generation of electrostatic charges are eliminated by a conductive layer for electrostatic shielding provided among a plurality of transparent protective layers, thereby enabling image information to be stably read.

Another object of the invention is to provide an image reading apparatus having a structure such that electrostatic shielding conductive layers are provided among a plurality of transparent protective layers; such that the conductive layers do not directly come into contact with an original and photoelectric converting elements. The abrasion of the conductive layers due to the rubbing by a paper and the deteriorations in the function for a countermeasure of the electrostatic charges in association with such an abrasion, in the optical stability, and in the function to protect the photoelectric converting elements can be eliminated by this structure. Accordingly high reliability can be obtained.

Still another object of the invention is to provide a photo-sensor having photoelectric converting elements arranged on a substrate and a transparent insulative protective layer formed on the photoelectric converting elements, wherein the transparent insulative protective layer is formed as a multi-layer structure. This photo-sensor has electrostatic shielding layers sandwiched among the transparent insulative protective layers.

Still another object of the invention is to provide an image reading apparatus having a photo-sensor comprising: an opaque layer formed on a transparent insulative substrate; an insulative layer arranged on the opaque layer; photoelectric converting elements arranged on the insulative layer; and a transparent insulative protective layer formed on the photoelectric converting elements. The transparent insulative protective layer is formed as a multi-layer structure, and a transparent conductive layer is provided or an opaque conductive layer having a window which is maintained at a constant potential and which is sandwiched by the transparent insulative protective layers.

Still another object of the invention is to provide a method of manufacturing a photo-sensor in which the potential of the electrostatic shielding layer can be simply held at a constant value.

Still another object of the present invention to provide a method of manufacturing a photo sensor having electrostatic shielding layers, comprising the steps of:
(a) forming photoelectric converting elements onto a substrate;
(b) forming a protective layer onto the photoelectric converting elements;
(c) preparing a microsheet glass and forming electrostatic shielding layers onto a first surface of the glass, a part of a second surface on the side opposite to the first surface, and at least one edge surface which continues to the second surface; and
(d) adhering the first surface formed with the electrostatic shielding layer onto the protective layer.

BRIEF DESCRIPTION OF THE DRAWINGS

FIG. 2B is a schematic cross-sectional view taken along the line B-B' in FIG. 2A;

DETAILED DESCRIPTION OF THE PREFERRED EMBODIMENTS

The present invention will be described in detail hereinbelow with reference to the drawings.

Figure 1A:
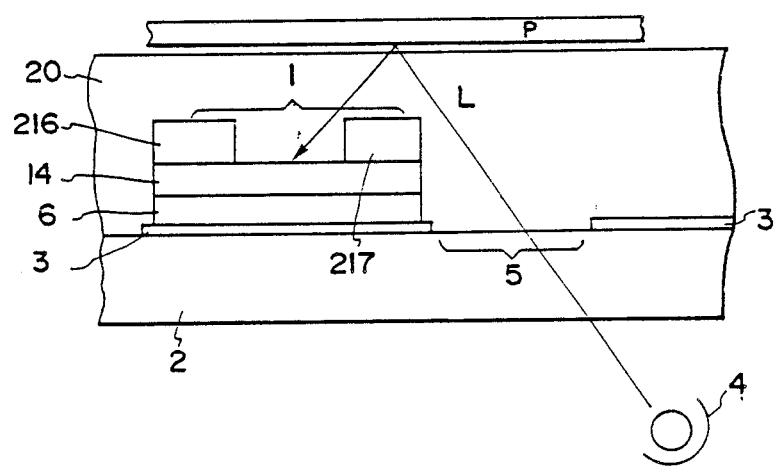
FIGS. 1-A, 1-B, and 1-C are explanatory diagrams schematically showing examples of conventional image reading apparatuses.
Figure 1B:
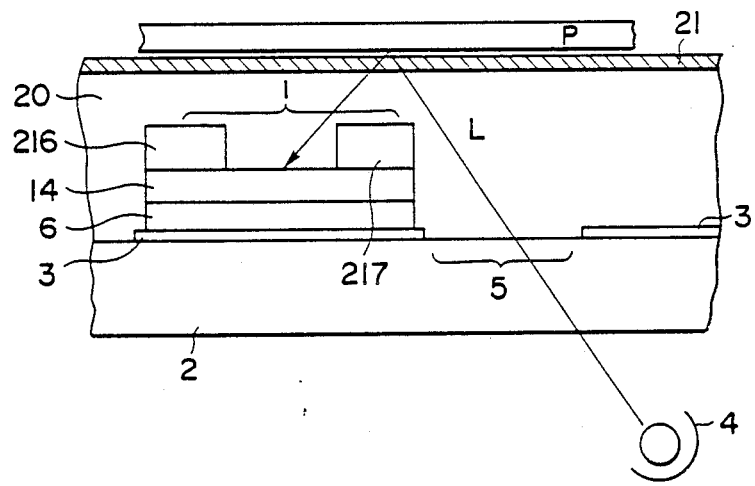
Figure 1C:
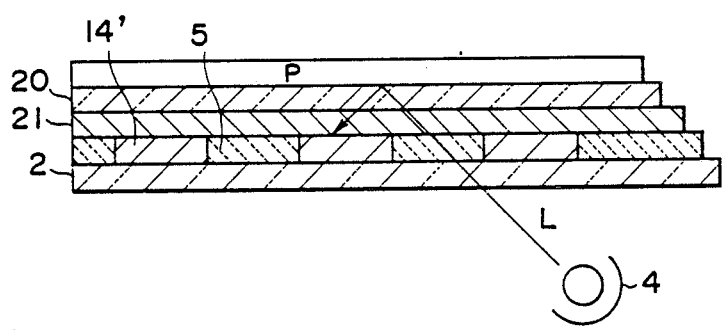
Figure 2A:
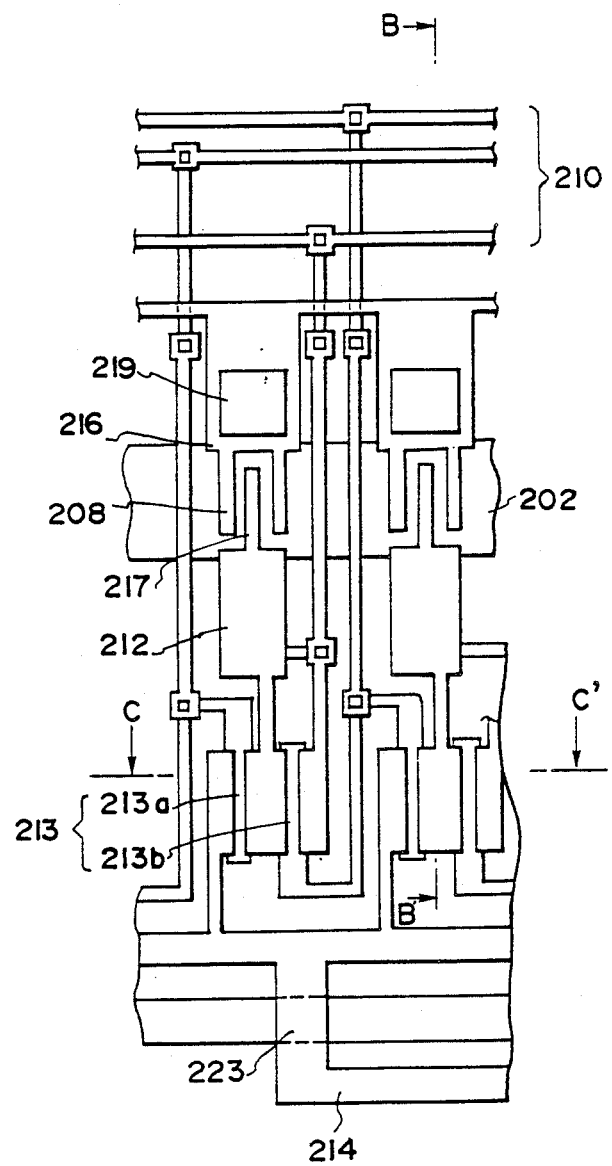
FIG. 2A is a schematic plan view showing the first embodiment of an image reading apparatus according to the present invention of the type in which a photo sensor section, a charge storage section, a switch section, and the like are integrally formed.
Figure 2C:
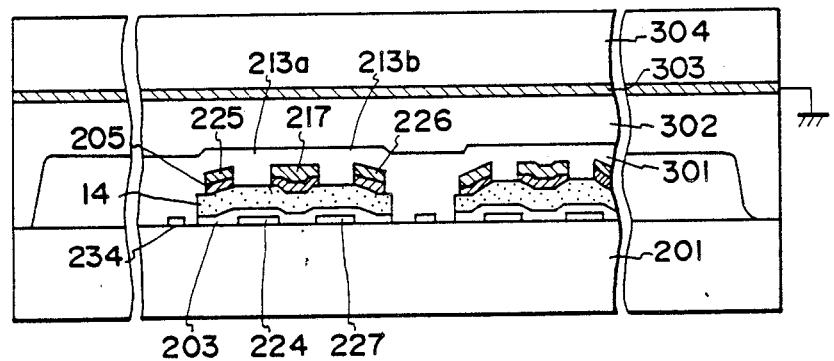
FIG. 2C is a schematic cross sectional view taken along the line C-C' in FIG. 2A.

FIG. 2 is a schematic explanatory diagram showing the portion corresponding to two bits of an image reading apparatus of the present invention. FIG. 2A shows a plan view, FIG. 2B is a cross-sectional view taken along the line B-B' in FIG. 2A, and FIG. 2C is a cross sectional view taken along the line C-C' in FIG. 2A.

In this embodiment, there is shown an image reading apparatus with the structure such that a photoelectric converting element section, a storage capacitor section, switching thin film transistor section (hereinafter, abbreviated to a TFT section), and a wiring matrix section are integrally formed on the same substrate. Although FIG. 2 shows the image reading apparatus corresponding to two bits, the actual image reading apparatus forms a one-dimensional line sensor by arranging a plurality of portions each corresponding to one bit in a line on the substrate.

For example, assuming that the resolution is set to 8 lines/mm for 216 mm, corresponding to the A4 size, of the original P (in the direction perpendicular to the moving direction of the original P), 1728 photoelectric converting element sections are arranged.

In the embodiment, the photoelectric converting element section, capacitor section to store an output of the photoelectric converting element section, switch section for allowing the charges stored in the capacitor section to be transferred and signal processed, necessary wiring pattern, and the like are formed on the substrate by the same manufacturing step.

In FIGS. 2A to 2C, reference numeral 201 denotes a transparent substrate; 210 is a matrix wiring section; 208 a photoelectric converting element section; 212 a charge storage section; 213 a switch section including a transfer switch 213a and a discharge switch 213b to reset the charges stored in the charge storage section 212; 214 a wiring to connect a signal output of the transfer switch 213a to a proper signal processing section; and 223 a load capacitor to store the charges which are transferred by the transfer switch 213a and to read out them.

In the embodiment, a photoelectric converting layer is used as the photoelectric converting element section 208 and a photoconductive semiconductor layer 14 consisting of A-Si:H is used as a semiconductor layer constituting the transfer switch 213a and discharge switch 213b. A silicon nitride film (SiNH), Si$_3$N$_4$, or the like formed by the glow discharge is used as an insulative layer 203.

In FIG. 2A, for simplicity of the drawing, only the electrode wirings in two upper and lower layers are shown and the photoconductive semiconductor layer 14, insulative layer 203, a protective layer section (such as elements 301 to 304 in FIG. 2B) are not shown.

On the other hand, the photoconductive semiconductor layer 14 and insulative layer 203 are formed in the photo-sensor section 208. Charge storage section 212, transfer switch 213a, and discharge switch 213b are also formed between the upper layer electrode wirings and the substrate. Further, an A-Si:H layer 205, which is doped to n+, is formed at the boundary surface between the upper electrode wirings 217 and the photoconductive semiconductor layer 14, thereby obtaining an ohmic junction.

On the other hand, in the wiring pattern of the line sensor in the embodiment, all of the signal paths which are output from each sensor section are wired so as not to cross the other wirings. Thus, the crosstalk among the signal components and the generation of the induction noises from the gate electrode wirings are prevented.

In the photoelectric converting element section 208, reference numerals 216 and 217 denote upper layer electrode wirings. The light is irradiated from a light source 230 arranged below and in proximity of the switch section 213 when it is seen from the image reading position. The light from the light source 230 enters through an incident window 219 and is reflected by the original surface. The reflected light changes the conductivity of the photoconductive semiconductor layer 14 made of A-Si:H, thereby changing a current flowing between the upper layer electrode wirings 216 and 217, which face each other like a comb. Reference numeral 202 denotes a light shielding layer made of metal or the like.

The charge storage section 212 comprises: the lower layer electrode wiring 214; the insulative layer 203 comprising dielectric materials and photoconductive semiconductor layer 14 formed on the lower layer electrode wiring 214; and a wiring which is formed on the semiconductor layer 14 and continues to the upper layer electrode wiring 217. The structure of the charge storage section 212 is the same as that of what is called an MIS (Metal-Insulator-Semiconductor) capacitor. Although the bias condition can be set to the positive or negative bias, by always setting the lower layer electrode wiring 214 to the negative bias condition, the stable capacitance and frequency characteristic can be obtained.

FIG. 2C shows the switch section 213 of the TFT structure including the transfer switch 213a and discharge switch 213b. The transfer switch 213a comprises: a lower layer electrode wiring 224 serving as a gate electrode (the wiring 224 also has serves the light shielding function for the switch 213a); the insulative layer 203 serving as a gate insulative layer; the photoconductive semiconductor layer 14; an upper layer electrode wiring 225 serving as a source electrode; and the upper layer electrode wiring 217 serving as a drain electrode. The gate insulative layer and photoconductive semiconductor layer of the discharge switch 213b are the same layers as the insulative layer 203 and photoconductive semiconductor layer 14. The source electrode corresponds to the upper layer electrode wiring 217. The gate electrode corresponds to a lower layer electrode wiring 227 (which also functions as a light shielding layer of the switch 213b). The drain electrode corresponds to an upper layer electrode wiring 226. A lower layer wiring 234 is connected to the gate electrode of the transfer switch 213a.

As mentioned above, the n+ layer 205 of A-Si:H exists on the boundary surfaces among the upper layer electrode wiring 217, 225, and 226 and the photoconductive semiconductor layer 14, thereby forming the ohmic contact.

Three protective layers are provided on and over the photoelectric semiconductor layer 14. First, the first passivation layer 301 to mainly protect and stabilize the surface of the semiconductor layer is formed on the upper layer electrode. The transparent insulative layer 304, having a high hardness to protect the whole apparatus from scratches by the original or the like, is formed on the uppermost portion which directly comes into contact with the original. The transparent insulative layer 304 is called an abrasion resistance layer. Further, the second passivation layer 302, to improve both of the close contacting property and the moisture resistance, is formed between the first passivation layer and the abrasion resistance layer. In addition, the electrostatic shielding layer 303, as an electrostatic charges countermeasure layer, is formed between the second passivation layer and the abrasion resistance layer.

In the embodiment, the first passivation layer 301 is made of a polyimide system resin, a polyamide system resin, SiN, SiO$_2$, or the like. The second passivation layer 302 is formed by an epoxy system resin coating. The transparent insulative layer 304 is made of microsheet glass having a thickness of about 50 μm. The electrostatic charges countermeasure layer 303 consists of a transparent conductive layer of ITO or the like which is formed on the back surface of the transparent insulative layer 304 by the evaporating deposition or the like. The transparent conductive layer 303 is held at a constant potential by arranging a conductive material between the transparent conductive layer and what is called a ground electrode on the substrate 201.

In the side edge surface portion of the sensor, the first passivation layer 301 is completely covered by the second passivation layer 302, so that the moisture resistance and adhesive property are improved.

Further, even for the charge storage section and the function element section such as transfer switch or the like, the adverse influences by the electrostatic charges can be prevented, so that the malfunction of the switching and the like can be also prevented.

EMBODIMENT 2

Figure 3A:
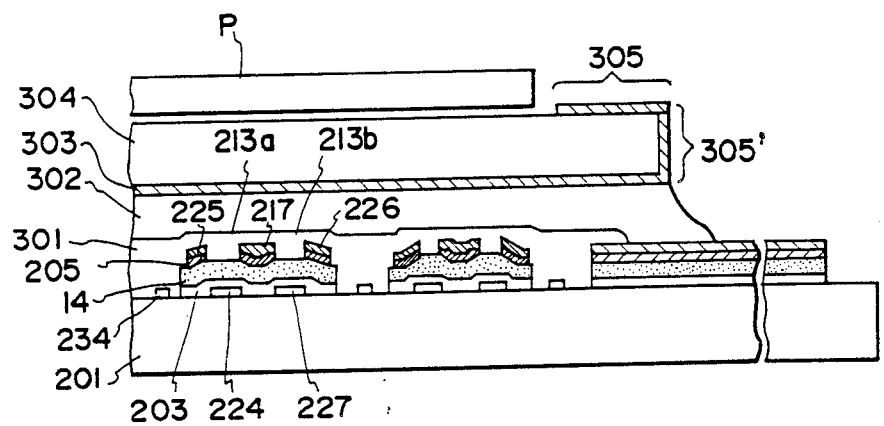
FIGS. 3A and 3B are a schematic cross sectional view respectively, and a schematic perspective view showing the second embodiment of an image reading apparatus according to the invention.
Figure 3B:
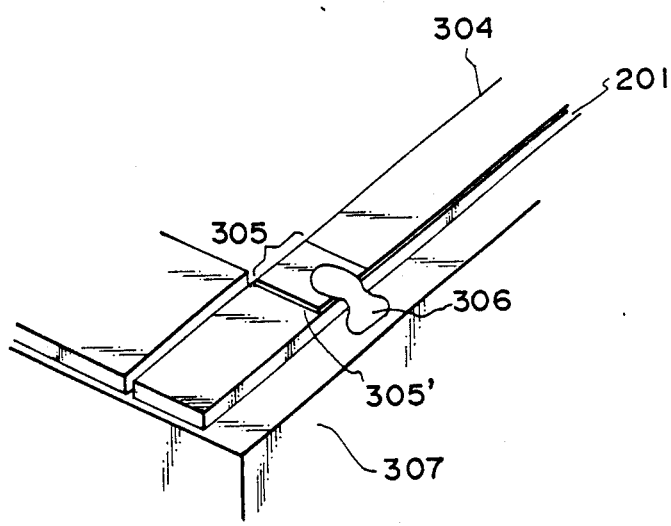
Figure 4:
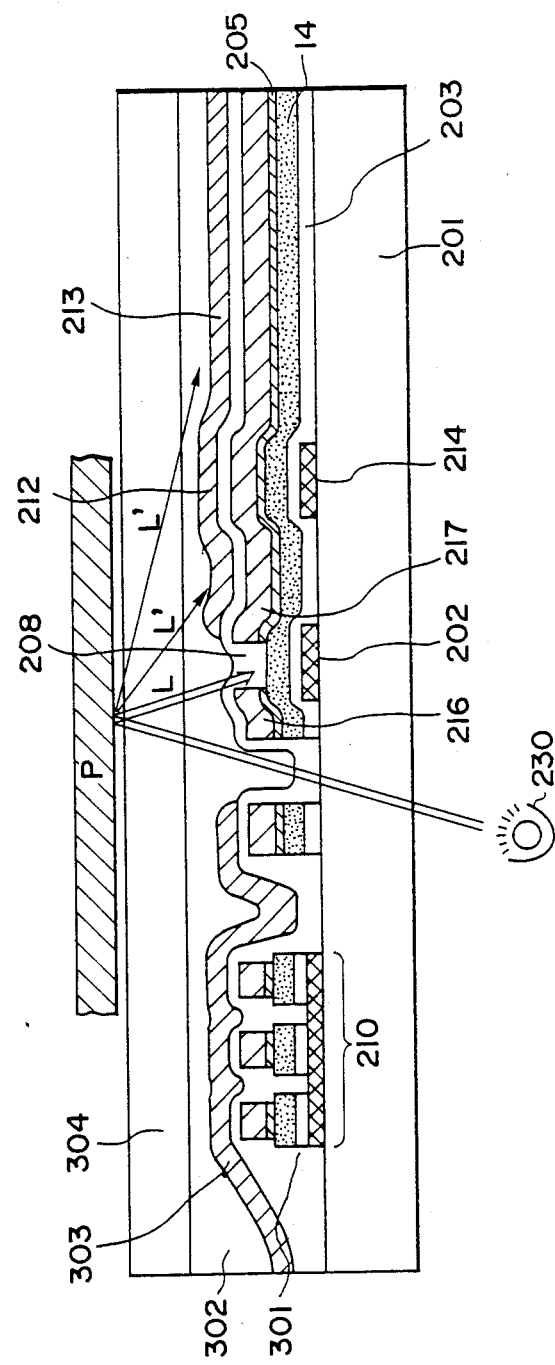
FIG. 4 is a schematic cross sectional view showing the third embodiment of an image reading apparatus according to the invention.

FIGS. 3A and 3B are a schematic cross-sectional view, respectively, and a schematic perspective view showing the second embodiment of an image reading apparatus of the present invention. FIG. 3A shows the portion corresponding to FIG. 2C.

In this embodiment, transparent conductive layers 303, 305, and 305' consisting of ITO or the like are formed as electrostatic shielding layers for an electrostatic charges countermeasure in the regions which do not directly come into contact with an original with respect to the surface of the transparent insulative layer 304 corresponding to the photoelectric converting element section, the side surface of the edge portion, and the surface which faces the original. In this embodiment, the first passivation layer made of a polyimide resin is formed on the photoelectric converting elements provided on the substrate. An epoxy resin, as the second passivation layer, is coated on the first passivation layer. Further, the electrostatic shielding layer is formed on the microsheet glass by using a method, which will be explained hereinlater, and is adhered through the epoxy resin. The transparent conductive layers 305 and 305' function as connecting electrodes to keep the transparent conductive layer 303 at a constant potential. The connecting electrodes 305 and 305' and the electrode to keep the transparent conductive layer 303 at a constant potential, what is called the ground electrode, are electrically connected by coating a conductive resin 306 onto the connecting electrodes 305 and 305' and onto a conductive casing 307 which is held to the constant potential. The other configuration is similar to FIG. 3. In this manner, it is possible to be easily grounded with the adhesive property held.

To realize the above configuration, there is needed a device in a film forming method of the transparent conductive layer 303 onto the microsheet glass constituting the transparent insulative layer 304. According to either an ordinary method of evaporation depositing, sputtering, electron beam, or a method whereby an organic metal compound is dipped and thereafter, it is burned, it is difficult to continuously form the layer of the transparent conductive layer onto the back surface of the microsheet glass and a part of the upper surface thereof. However, in this embodiment, the above structure is accomplished by using the metal fog method (refer to JP-B-No. 55-15545) as a kind of the CVD method.

According to the method of evaporation depositing, sputtering, electron beam, or dipping, the film thickness in the cut corner portion of the glass becomes extremely thin due to the influences by the rectilinearity, gravity, surface tension, and the like of the evaporated particles, and the electrical connection becomes unstable. On the other hand, when the thickness of the glass is so thick as to be about 1 mm, by chamfering the corner portion of the glass, the reduction of the film thickness can be also decreased. However, it is difficult to apply this chamfering method to the microsheet glass having a thickness of about 50 μm.

On the other hand, according to the metal fog method, the fluid in which the organic metal compound as a base material of ITO is dissolved is converted into a mist consisting of microparticles and deposited onto the glass substrate. Therefore, by adjusting the setting position of the glass substrate, progressing direction, and progressing speed, the transparent conductive layer 303 can be uniformly formed on the surfaces around the edge of the microsheet glass. Thus, the electrostatic shielding layer having the stable electrical connection can be easily formed.

As a method of connecting the connecting electrodes 305 and 305' and ground electrode, there is known a method whereby a conductive rubber is mechanically pressed, a method by soldering, or the like, as well as the method in the embodiment.

As described above, according to the second embodiment of the invention, the electrostatic shielding layer and ground electrode formed between the second passivation layer and the transparent insulative layer 304 can be easily connected and the potential of the electrostatic shielding layer can be easily held to a constant value.

On the other hand, since there is no need to perform the electrical connection at the side surface in the edge portion sandwiched by the second passivation layer and the transparent insulative layer, the entering of the water from the edge portion side surface can be prevented and the adhesive property and moisture resistance can be further improved.

As described above, according to the structures in the first and second embodiments, even if the electrostatic charges are generated on the microsheet glass due to the contact with the original, the photo-sensor section and the function element sections such as capacitor section and thin film transistor section are electrically shielded by the transparent conductive layer. Accordingly, the influences such as signal level shift, malfunction, breakage of the element, or the like on the element by the electrostatic charges can be eliminated to the level which does not practically cause a problem.

Moreover, since the electrostatic shielding layer is provided between the protective layers, the photoelectric converting layer and electrostatic shielding layer can be electrically mechanically protected and the electrostatic shielding layer is not abraded. Thus, the optically excellent image reading apparatus can be obtained.

EMBODIMENT 3

In the first and second embodiments, the electrostatic shielding layer as the electrostatic charges countermeasure layer has been made of a transparent conductive material of ITO or the like. However, this layer can be also made of an opaque conductive material having a window.

Figure 5:
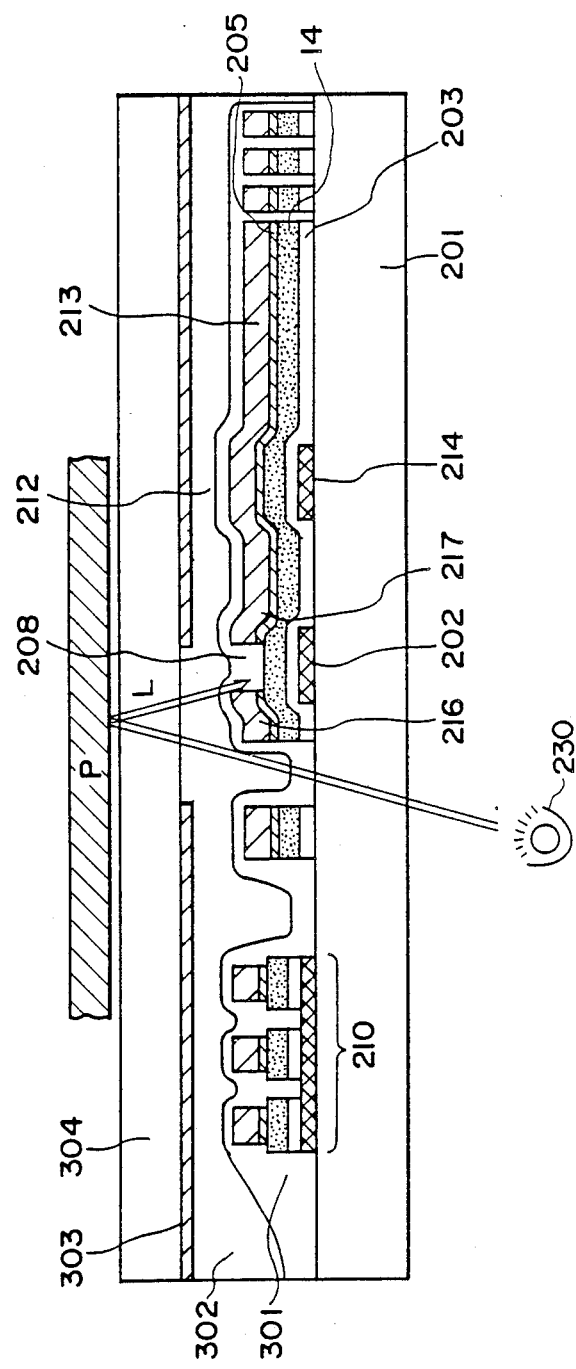
FIG. 5 is a schematic cross sectional view showing the fourth embodiment of an image reading apparatus according to the invention.

FIG. 5 shows the third embodiment of the invention regarding such an example. This diagram shows the portion corresponding to FIG. 2B and the parts and components indicated at reference numerals 201 to 214 and 14 are similar to those shown in the first embodiment.

In the third embodiment, the first passivation layer 301 is mainly formed on the upper layer electrode. The opaque conductive layer 303 is formed on the first passivation layer 301. The second passivation layer 302 is formed on the opaque conductive layer 303. The abrasion resistance layer 304 is formed on the passivation layer 302. The first and second passivation layers are provided for the same purpose in the first embodiment. The opaque conductive layer is not formed in the portion corresponding to the optical path L along which the light emitted from the light source is irradiated onto the original and the light reflected by the original reaches the photo sensor section, thereby forming what is called a window.

In this embodiment, the first passivation layer 301 is formed by polyimide silicone nitride, or silicone dioxide The opaque conductive layer 303 is made of a metal film of Al, Cr, or the like. The passivation layer 302 is formed by an epoxy system resin. The abrasion resistance layer 304 consists of a microsheet glass having a thickness of about 50 μm.

With the structure of the third embodiment, the effects similar to those in the first and second embodiments are derived. Further, since the electrostatic shielding layer is opaque and is located near the elements in the lower portion, a preferable effect as a contact type image reading apparatus is derived.

In general, the light irradiated onto the original is irregularly reflected and the reflected light progresses not only in the direction of the photo sensor section but also in the direction of the capacitor section or switching thin film transistor section, so that there is a case where the leakage light causes the signal level shift or malfunction. Particularly, when the image reading density increases and the distance between the elements decreases, this tendency is enhanced. However, in the structure in the third embodiment, since the opaque conductive layer as the electrostatic charges countermeasure layer shields unnecessary reflected light L', so that this layer also has the function to prevent the malfunction of the thin film transistor which hates the light irradiation. Further, since the electrode layer which is held to a constant potential faces the upper layer electrode of each element through only the first passivation layer, the capacitive component is newly produced between the upper layer electrode and the constant potential. Thus, there is an advantage such that the signal crosstalk between the adjacent bits or the like are reduced. Moreover, in the capacitor section which occupies a large area, the opposite electrode which is held to a constant potential is newly produced on the upper layer electrode, so that there is a large advantage in terms of the reduction in area and the high density. Namely, as advantages of the opaqueness, the unnecessary irregularly reflected light is shielded. As an advantage of the close arrangement of the opaque conductive layer from the elements, the crosstalks are reduced and the area of the capacitor section is decreased. Since the transparency and opaqueness of the electrostatic shielding layer and the arranging position thereof are the elements which can be independently selected. Therefore, it is sufficient to select the suitable structure of the electrostatic shielding layer in accordance with a desired advantage.

EMBODIMENT 4

FIG. 5 shows a schematic cross sectional view of a sensor in the embodiment. In this embodiment, an opaque conductive layer made of Al, Cr, or the like is provided as an electrostatic shielding layer between the abrasion resistance layer consisting of a microsheet glass and the second passivation layer made of an epoxy system resin.

An illumination window is formed in the opaque conductive layer. The fourth embodiment is constituted in a manner similar to the Embodiment 2 except that the opaque conductive layer having the illumination window is used as an electrostatic shielding layer.

As described above, by providing the opaque conductive layer between the abrasion resistance layer and the second passivation layer, the following advantages are obtained: (1) The connection to the ground electrode can be easily performed; (2) The moisture resistance and adhesive property are improved; and (3) The adverse influences by the unnecessary reflected light can be prevented.

Although the above embodiment has been described by using what is called the TFT type sensor as the photoelectric converting element, the invention is not limited to the type of photoelectric converting element but can be also applied to other types such as photoconductive type photodiode type, phototransistor type, sandwiching type, and the like.

Figure 6:
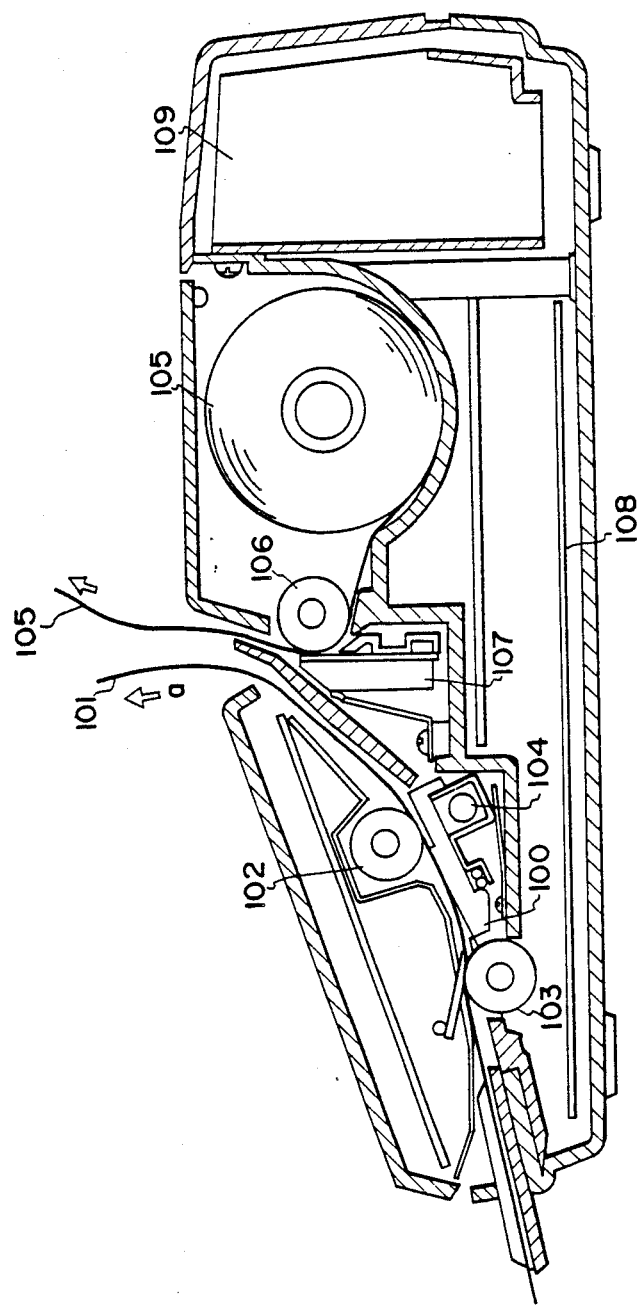
FIG. 6 is a schematic side elevational view with parts cut away of a facsimile apparatus using the image reading apparatus according to the invention.

FIG. 6 is a schematic arrangement diagram of a facsimile apparatus using the image reading apparatus according to the invention.

In the diagram, when an original image is transmitted, an original 101 is pressed onto a contact type image sensor 100 by a platen roller 102 and moved in the direction of an arrow a by the platen roller 102 and a feed roller 103. The surface of the original is illuminated by a xenon lamp 104 as a light source. The reflected light from the original is input to the sensor 100 and converted into the electric signal corresponding to the image information of the original and transmitted.

In the reception mode, a recording paper 105 is conveyed by a platen roller 106 and the image corresponding to the reception signal is reproduced by a thermal head 107.

The whole apparatus is controlled by a controller of a system control substrate 108. Electric power is supplied from a power source 109 to each drive system and each circuit.

By applying the image reading apparatus of the embodiment as a contact type image sensor to such a facsimile apparatus, it is possible to provide a facsimile apparatus whose costs and size are further reduced.

As described in detail above, according to the present invention, there is provided a simple structure such that the transparent conductive layer or opaque conductive layer having a window is formed between the transparent protective layers of a multi-layer structure on the photoelectric converting element. Even by use of such a simple structure, the inconvenience due to the generation of the electrostatic charges is reduced to the level which does not practically cause any problem and at the same time, the photoelectric converting elements can be protected, abrasion of the conductive layer by the rubbing by the paper can be eliminated, and the like. Further, according to the foregoing different structure, there can be also obtained advantages such as shield of the unnecessary irregular light, reduction in crosstalks, and decrease in area of the capacitor section.

On the other hand, by using the structure of the invention, a compact photoelectric converting apparatus with the improved reliability can be provided.

What is claimed is:

1. A photo-sensor comprising:
   plural photoelectric converting elements arranged on a substrate;
   a transparent insulative protective element disposed over said plural photoelectric converting elements; and
   an electrostatic shielding layer disposed over said substrate,
   wherein said transparent insulative protective element comprises a multi-layer structure, and wherein at least one layer of said multi-layer structure is disposed on each side of said electrostatic shielding layer.

2. A photo-sensor according to claim 1, wherein said electrostatic shielding layer comprises a transparent conductive layer.

3. A photo-sensor according to claim 2, wherein said transparent conductive layer comprises ITO.

4. A photo-sensor according to claim 1, wherein said electrostatic shielding layer comprises an opaque conductive layer having a light transmitting portion.

5. A photo-sensor according to claim 4, wherein said opaque conductive layer comprises a metal film.

6. A photo-sensor according to claim 5, wherein said metal film comprises a material selected from the group consisting of aluminum and chromium.

7. A photo-sensor according to claim 1, wherein said transparent insulative protective element disposed over said photoelectric converting elements comprises a first passivation layer, a second passivation layer disposed thereon, and an abrasion resistance layer disposed on said second passivation layer.

8. A photo-sensor according to claim 7, wherein said electrostatic shielding layer is disposed between said first and second passivation layers.

9. A photo-sensor according to claim 7, wherein said electrostatic shielding layer is disposed between said second passivation layer and said abrasion resistance layer.

10. A photo-sensor according to claim 7, wherein said first passivation layer comprises a material selected from the group consisting of a polyimide system resin and a polyamide system resin.

11. A photo-sensor according to claim 7, wherein said first passivation layer comprises a material selected from the group consisting of SiN and $SiO_2$.

12. A photo-sensor according to claim 7, wherein said second passivation layer comprises an epoxy system resin.

13. A photo-sensor according to claim 7, wherein said abrasion resistance layer comprises glass.

14. A photo-sensor according to claim 1, wherein said electrostatic shielding layer is grounded.

15. A photo-sensor according to claim 1, wherein said electrostatic shielding layer covers an upper portion of said protective element at a side edge surface thereof.

16. A photo-sensor according to claim 1, wherein said substrate is transparent.

17. A photo-sensor according to claim 1, further comprising a capacitor section to store the output of said photoelectric converting elements.

18. A photo-sensor according to claim 17, further comprising a switch section to transfer the charges stored in said capacitor section to a signal processing section.

19. A photo-sensor according to claim 1, wherein said photoelectric converting elements comprise a photoconductive layer consisting of amorphous silicon.

20. A photo-sensor comprising:
   a transparent insulative substrate;
   an opaque layer disposed on said transparent insulative substrate;
   an insulative layer arranged on said opaque layer;
   photoelectric converting elements arranged on said insulative layer;
   a transparent insulative protective element disposed over said photo-electric converting elements, wherein said transparent insulative protective element comprises a multi-layer structure; and
   a conductive layer comprising a transparent conductive material, wherein at least one layer of said multilayer structure of said transparent insulative protective element is disposed on each side of said conductive layer, and wherein said conductive layer is maintained at a constant potential.

21. A photo-sensor apparatus according to claim 20, wherein said photoelectric converting elements are arranged on a straight line in correspondence to an entire width of an original, wherein light is irradiated through said transparent insulative substrate from one side thereof, and wherein the light is reflected from a surface of the original and is received by said photoelectric converting elements.

22. A photo-sensor apparatus according to claim 20, wherein said conductive layer is disposed between said photoelectric converting elements and said at least one layer of said multilayer structure which comes into contact with an original, on an edge portion of a side surface of said at least one layer, and on a portion of a surface, facing the original, of said at least one layer which does not come into contact with the original.

23. A photo-sensor apparatus according to claim 20, wherein said photoelectric converting elements are arranged on a straight line in correspondence to an entire width of an original, wherein light is irradiated through said transparent insulative substrate from one side thereof, and wherein the light is reflected from a surface of the original and is received by said photoelectric converting elements.

24. A photo-sensor apparatus according to claim 20, wherein said conductive layer is disposed between said photoelectric converting elements and said at least one layer of said multilayer structure which comes into contact with an original, on an edge portion of a side surface of said at least one layer, and on a portion of a surface, facing the original, of said at least one layer which does not come into contact with the original.

25. A photo-sensor comprising:
   a transparent insulative substrate;
   an opaque layer disposed on said transparent insulative substrate;
   an insulative layer arranged on said opaque layer;
   photoelectric converting elements arranged on said insulative layer;
   a transparent insulative protective element disposed over said photo-electric converting elements, wherein said transparent insulative protective element comprises a multi-layer structure; and
   a conductive layer comprising an opaque conductive material, said conductive layer having a window, wherein at least one layer of said multilayer structure of said transparent insulative protective element is disposed on each side of said conductive layer and wherein said conductive layer is maintained at a constant potential.

* * * * *

UNITED STATES PATENT AND TRADEMARK OFFICE
CERTIFICATE OF CORRECTION

PATENT NO. : 4,982,079
DATED : January 1, 1991
INVENTOR(S) : Mineto Yagyu

It is certified that error appears in the above-identified patent and that said Letters Patent is hereby corrected as shown below:

On the title page, item (54) Title:

"ELECTROSTASLIC" should read --ELECTROSTATIC--.

IN [56] REFERENCES CITED

OTHER PUBLICATIONS, "$DdIn_2O_4$" should read --$CdIn_2O_4$--.

COLUMN 1

Line 4, "ELECTROSTASLIC" should read --ELECTROSTATIC--.

COLUMN 7

Line 52, "electrically mechanically" should read
--electrically and mechanically--.

Signed and Sealed this

Sixth Day of July, 1993

Attest:

MICHAEL K. KIRK

Attesting Officer

Acting Commissioner of Patents and Trademarks